(12) United States Patent
Aulnette et al.

(10) Patent No.: US 6,991,995 B2
(45) Date of Patent: Jan. 31, 2006

(54) METHOD OF PRODUCING A SEMICONDUCTOR STRUCTURE HAVING AT LEAST ONE SUPPORT SUBSTRATE AND AN ULTRATHIN LAYER

(75) Inventors: Cécile Aulnette, Grenoble (FR); Benoît Bataillou, Grenoble (FR); Bruno Ghyselen, Seyssinet-Pariset (FR); Hubert Moriceau, Saint Egreve (FR)

(73) Assignees: S.O.I.Tec Silicon on Insulator Technologies S.A., Bernin (FR); Commissariat à l' Energie Atomique (CEA), Paris (FR)

( * ) Notice: Subject to any disclaimer, the term of this patent is extended or adjusted under 35 U.S.C. 154(b) by 50 days.

(21) Appl. No.: 10/784,032

(22) Filed: Feb. 20, 2004

(65) Prior Publication Data

US 2004/0248380 A1    Dec. 9, 2004

(30) Foreign Application Priority Data

Jun. 6, 2003   (FR) .................................. 03 06843

(51) Int. Cl.
*H01L 21/30* (2006.01)
*H01L 21/46* (2006.01)

(52) U.S. Cl. ....................... 438/458; 438/455; 438/459
(58) Field of Classification Search ................ 438/455, 438/458, 459
See application file for complete search history.

(56) References Cited

U.S. PATENT DOCUMENTS

| | | | |
|---|---|---|---|
| 6,100,166 A | 8/2000 | Sakaguchi et al. | 438/455 |
| 6,328,796 B1 * | 12/2001 | Kub et al. | 117/94 |
| 6,335,258 B1 | 1/2002 | Aspar et al. | 438/406 |
| 6,500,732 B1 * | 12/2002 | Henley et al. | 438/459 |
| 2004/0029359 A1 | 2/2004 | Letertre et al. | 438/458 |
| 2004/0175901 A1 | 9/2004 | Hadji et al. | 438/458 |

FOREIGN PATENT DOCUMENTS

| | | |
|---|---|---|
| WO | WO 00/48278 | 8/2000 |
| WO | WO 02/43112 A2 | 5/2002 |

OTHER PUBLICATIONS

Aaron Hand, Value-Added Wafers Push Chips Ahead, Semiconductor International, (2002).
M. Bruel, "Silicon on insulator material technology" by, "Electron Letter", 31, 1201 (1995).
Q. Y. Tong, G. Cha, R. Gafiteau, and U. Gösele, "Low temperature wafer direct bonding", Journal of Microelectromechanical Systems, 3, 29 (1994).
Jean-Pierre Colinge, "Silicon-On-Insulator Technology: Materials to VLSI", 2nd Edition by, published by "Kluwer Academic Publishers", at pp. 50 and 51.

* cited by examiner

*Primary Examiner*—Asok Kumar Sarkar
(74) *Attorney, Agent, or Firm*—Winston & Strawn LLP

(57) ABSTRACT

A method of producing a semiconductor structure having at least one support substrate and an ultrathin layer. The method includes bonding a support substrate to a source substrate, detaching a useful layer along a zone of weakness to obtain an intermediate structure including at least the transferred useful layer and the support substrate, and treating the transferred useful layer to obtain an ultrathin layer on the support substrate. The source substrate includes a front face and a zone of weakness below the front face that defines the useful layer, and the useful layer is sufficiently thick to withstand heat treatments without forming defects therein so that it can be reduced in thickness to form the ultrathin layer. The resulting ultrathin layer is suitable for use in applications in the fields of electronics, optoelectronics or optics.

20 Claims, 4 Drawing Sheets

METHOD OF PRODUCING A SEMICONDUCTOR STRUCTURE HAVING AT LEAST ONE SUPPORT SUBSTRATE AND AN ULTRATHIN LAYER

BACKGROUND ART

The present invention generally relates to a method of producing a structure including at least one support substrate and an ultrathin layer of a semiconductor material. An embodiment of the invention advantageously includes an intermediate layer between the support substrate and the ultrathin layer.

Composite substrates are fabricated for use in the fields of optics, electronics, or optoelectronics. During fabrication, layer transfer methods can be used to transfer a layer from a source substrate onto a support substrate. One such layer transfer method includes implanting atomic species beneath the surface of a source substrate to create a zone of weakness therein which defines a thin layer. The free face of the thin layer is then brought into intimate contact or bonded with the support substrate. The thin layer is then detached from the remainder of the source substrate to transfer it to the support substrate. This type of method is known as the "SMART-CUT®" technique, and is described in the document entitled "Silicon-On-Insulator Technology; Materials to VLSI", 2nd Edition by J.-P. Colinge, edited by Kluwer Academic Publishers, pages 50 and 51.

The current trend in the field is to transfer thinner and thinner layers onto a support to obtain composite substrates from which electronic components can be fabricated that can function at faster speeds than existing components. Reference can be made to the article by Aaron Mand, "Value-Added Wafers Push Chips Ahead", Semiconductor International, November 2002.

However, experiments have shown that when the thin layer to be transferred is very thin, meaning less than about 100 nanometers (nm), defects appear which do not occur when transferring a thicker layer. Such a very thin layer will not withstand subsequent heat treatments conducted either to strengthen its bonding interface with the support substrate, or to detach it from the source substrate. The heat treatments increase the pressure that exists in gas microbubbles present in the zone of weakness and cause them to degas, resulting in the formation of defects. The very thin transferred layer thus contains many defects such as blisters or may partially delaminate.

Further, it appears that when a very thin layer is transferred onto a support substrate, the quality of the bond obtained is far more sensitive to the presence of particles or hydrocarbons on the surface layers to be bonded than a thicker layer. Similarly, when an intermediate layer is present between the thin layer to be transferred and the support substrate, it has been shown that the thinner the transferred thin layer, the more defects it contains.

FIG. 1 shows a theoretical plot of the total thickness ET of the transferred layer, which is the sum of the thickness of the thin layer and the intermediate layer, as a function of the number of defects ND in the finished structure, for a given thickness of the intermediate layer. FIG. 1 is for illustrative purposes only, but shows that for a given intermediate layer thickness (solid line) there is a limiting thickness $EL_1$ for the transferred thin layer. Smaller values result in the transfer of a layer containing defects. When the intermediate layer is thinner (dotted line), the limiting thickness $EL_2$ for the transferred thin layer is larger.

In the particular case of fabricating silicon on insulator (SOI) substrates, atomic species, which are generally hydrogen ions, are implanted through the surface of a silicon substrate having an outer, oxidized surface. Next, a second silicon substrate is bonded onto the assembly. After detaching and annealing, the SOI substrate includes a layer of bulk silicon covered with a layer of oxide ($SiO_2$), and a layer of transferred silicon is obtained (see the article "Silicon on insulator material technology" by M. Bruel, "Electron Letter", 31, 1201 (1995)).

It has been shown that the transferred silicon layer contains defects when it is less than a certain thickness, which are worse if a high temperature heat treatment is also used. Reference should be made in this regard to the article by Q. Y. Tong, G. Cha, R. Gafiteau, and U. Gösele, "Low temperature wafer direct bonding", Journal of Micro-electromechanical Systems, 3, 29 (1994). A possible explanation for the appearance of the defects is the occurrence of degassing at the bonding interface between the layer of silicon oxide and the second silicon substrate.

During an annealing heat treatment, termed a "stabilization treatment", which takes place after the detaching step, a gas is formed at the bonding interface. In the case of a thick SOI substrate, the transferred layer is thick and acts as a stiffener. Further, it is assumed that the oxide layer, which is also thick, acts as a sponge which absorbs the gas released from the bonding interface. In the case of a thin SOI substrate in which the transferred layer and/or oxide layer is/are thin, the absorption phenomena and the stiffening effect do not occur, and degassing results in poor adhesion at the bonding interface.

A further possible explanation is that in thin SOI substrates, hydrogen is implanted at a shallow depth with respect to the bonding interface. The transferred layer is thus saturated with hydrogen, which tends to migrate by diffusion in the direction of the bonding interface.

SOI substrates obtained using current techniques comprise buried oxide layers ($SiO_2$) and superficial silicon layers having thickness values that are between 100 nm and 1.5 micrometers ($\mu$m). It has been difficult to obtain good quality SOI substrates in which the two layers are thinner than that mentioned above. Experiments have been conducted to try to strengthen the bond between the layers, but these trials have not achieved satisfactory results.

SUMMARY OF THE INVENTION

Presented is a method of producing a semiconductor structure having at least one support substrate and an ultrathin layer. The method includes bonding a support substrate to a source substrate, detaching a useful layer along a zone of weakness to obtain an intermediate structure including at least the transferred useful layer and the support substrate, and treating the transferred useful layer to obtain an ultrathin layer on the support substrate. The source substrate includes a front face and a zone of weakness below the front face that defines the useful layer. Advantageously, the useful layer is sufficiently thick to withstand heat treatments without forming defects therein so that it can be reduced in thickness to form the ultrathin layer. The resulting ultrathin layer is suitable for use in applications in the fields of electronics, optoelectronics or optics.

In an advantageous embodiment, the method further includes providing an intermediate layer on the support substrate or on the source substrate before the bonding step such that, after the detaching step, an alternate intermediate structure is obtained that includes the support substrate, the intermediate layer and the useful layer. The intermediate layer may have a thickness that is equal or less than about 50 nanometers. In addition, the intermediate layer may be made of insulating material, and may be made of at least one of silicon oxide, silicon nitride, a high permittivity insulating material, diamond, or a combinations of the materials.

In a preferred embodiment, the useful layer is at least three times thicker than the ultrathin layer before treatment. In particular, the useful layer may be at least about 300 nanometers thick. The ultrathin layer may thus be equal to or less than about 100 nanometers thick following the treating step, and may be less than about 50 nanometers thick.

In an advantageous implementation, the method may include treating the transferred useful layer by using at least one of chemical-mechanical polishing, annealing in an atmosphere containing hydrogen, argon or a mixture thereof, sacrificial oxidation, and chemical etching. Heat annealing could also be conducted after the bonding step and before the treatment step, or could be conducted during the detaching step, or could be conducted before the detaching step.

The method may advantageously include providing the zone of weakness by atomic species implantation, or providing the zone of weakness as a porous layer in the source substrate. In addition, the method may include applying at least one of mechanical and thermal stresses during the detaching step, and could include etching cavities into a front face of the useful layer before bonding. In a preferred embodiment, the source substrate is made of at least one of silicon, silicon carbide, germanium, silicon germanium, a Group (IV—IV) compound material, and a Group (III–V) compound material. In addition, the support substrate could be made of at least one of silicon, silicon carbide, germanium, silicon germanium, a Group (IV—IV) compound, and a Group (III–V) compound.

The present invention thus overcomes the disadvantages of the prior art to provide a method capable of transferring a useful layer to a support substrate, and optionally including an intermediate layer, and processing the structure to obtain an ultrathin layer which may be less than about 50 nanometers thick, and in some cases less than about 20 nm thick. The invention is of particular application when fabricating substrates having a stack of layers, wherein some of the layers are sensitive to degassing.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

FIGS. 2A to 2E and 3A to 3E are diagrams illustrating two embodiments of the present method. The different layers and their thickness values have not been drawn to scale, and various components have been deliberately enlarged in places for ease of understanding.

Figure 1:
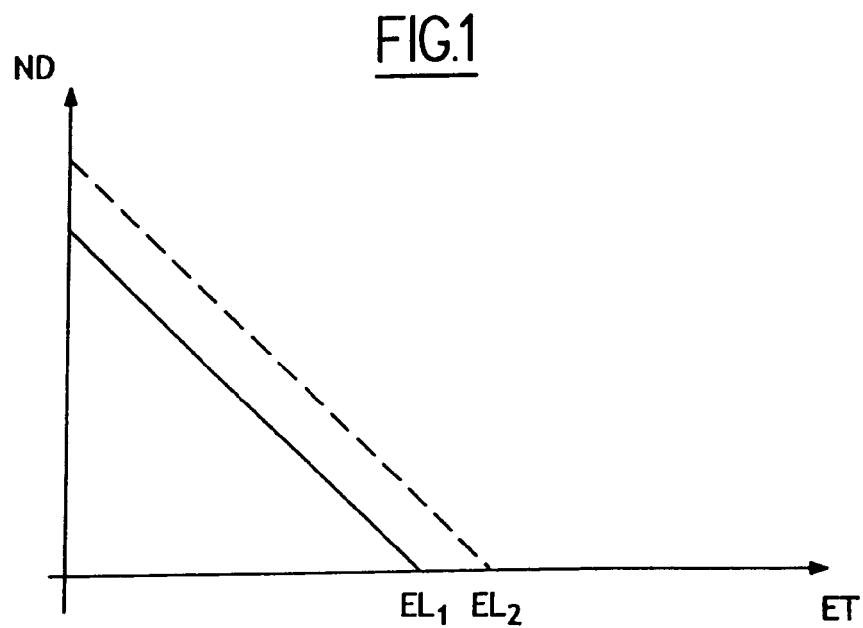
FIG. 1 is a graph showing the total thickness ET of a transferred layer, including a thin layer and an intermediate layer, as a function of the number of defects ND observed in the finished structure for two different thickness values of the intermediate layer.
Figure 2A:
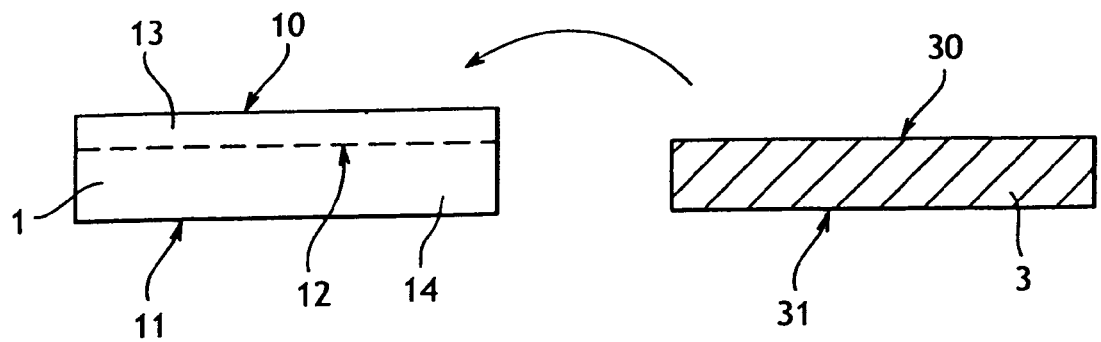
FIGS. 2A to 2E illustrate the steps of a first embodiment of a method for forming a semiconductor structure having an ultrathin layer on a substrate according to the invention.

FIG. 2A shows a source substrate 1 which has an internal zone of weakness 12 that defines two portions, namely a useful layer 13 which will be transferred, and a remainder 14 or back portion of the source substrate. The source substrate has a face 10 called the "front face" which will come into contact with a support substrate 3 and is located on the side of the useful layer 13. An opposite face 111 is termed the "back face".

In an implementation, the zone of weakness 12 is obtained by implanting atomic species. The expression "implanting atomic species" means any bombardment of atomic species, molecular or ionic, which can introduce the species into a material. The concentration of the species is maximized at a predetermined depth with respect to the surface 10 during bombardment. The molecular or ionic atomic species are introduced into the material at an energy level that is distributed about a maximum value. Atomic species can be implanted in the source substrate 1 by using, for example, an ion beam implanter or a plasma immersion implanter. Preferably, implantation is carried out by ion bombardment, and the implanted ionic species is hydrogen. Other ionic species can advantageously be used, alone or in combination with hydrogen, such as rare gases (for example helium).

The implantation process creates the zone of weakness 12 which is substantially parallel to the plane of the front face 10 in the bulk of the source substrate 1 at a mean ion penetration depth. For a more detailed explanation, reference can be made to the literature concerning the SMART-CUT® method as mentioned above. The zone of weakness 12 can also be a porous layer that is formed, for example, according to the method described in U.S. Pat. No. 6,100,166.

The useful layer 13 which is to be transferred can also include etched cavities in the front face 10, and such a layer is known by the skilled person as a "suspended layer". Such a layer is used in the production of micro-electromechanical systems (MEMS).

The support substrate 3 acts as a mechanical support and thus it has a thickness value of several hundred micrometers (typically about 300 μm). During bonding, the front face 30 will come into contact with the front face 10 of the source substrate 1, and the support substrate includes an opposite face 31 termed the "back face".

The source substrate 1 and the support substrate 3 can be made of any suitable material, in particular those used routinely in applications in the fields of electronics, optoelectronics or optics, such as semiconductor materials. By way of example, it is possible to use silicon, a material that is frequently used in such applications, or silicon carbide, germanium, silicon germanium, Group (IV—IV) compounds, and Group (III–V) compounds, or a combination of the materials. For example, a multilayer substrate may include at least two layers of materials selected from those cited above, as a constituent material of the support substrate 3 and the source substrate 1.

Group (IV—IV) compounds are compounds having two elements that belong to column IVa of the periodic table. Group (III–V) compounds are compounds having one element that is from column IIIa of the periodic table and another element that is from column Va, such as gallium nitride (GaN), gallium arsenide (AsGa), or indium phosphide (InP).

Regardless of how the zone of weakness 12 is made, it will be formed so that the useful layer 13 to be transferred is very thick with respect to the thickness of the final layer which is to be obtained on the support substrate 3. The characteristics concerning the thickness of the useful layer which will be transferred 13 is described below.

Figure 2B:
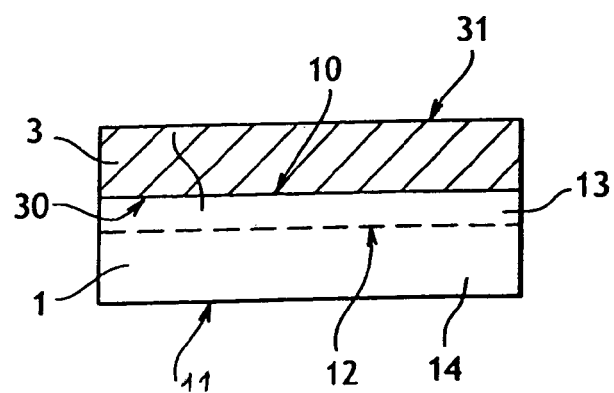

As shown in FIG. 2B, the front face 30 of the support substrate 3 is bonded by wafer bonding to the front face 10 of the source substrate 1. Advantageously, an annealing heat treatment is carried out on the stack to strengthen the bonding interface between the front face 10 of the source substrate 1 and the front face 30 of the support substrate 3. The heat treatment is carried out at a temperature that is suitable as a function of the chemical nature of the materials that are in contact.

Figure 2C:
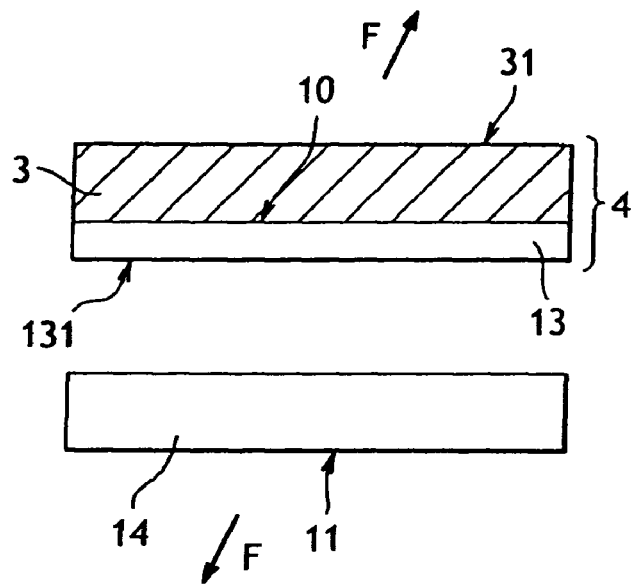

Referring to FIG. 2C, the support substrate 3 and the useful layer 13 are then detached from the remainder 14 of the source substrate 1 along the zone of weakness 12. Detachment occurs, for example, by applying mechanical stresses, which are generally tension and/or bending and/or shear stresses. The stresses can be applied, for example, by using a drawing rig, or by using one or more blades that attack the side of the stack of layers at the zone of weakness 12, or by using a jet of fluid (liquid or gas) applied laterally at the zone of weakness. The application of such mechanical stresses encourage the propagation of a crack at the zone of weakness 12. Thermal stresses could also be applied to obtain detachment, and mechanical and thermal stresses can also be combined.

Figure 2D:
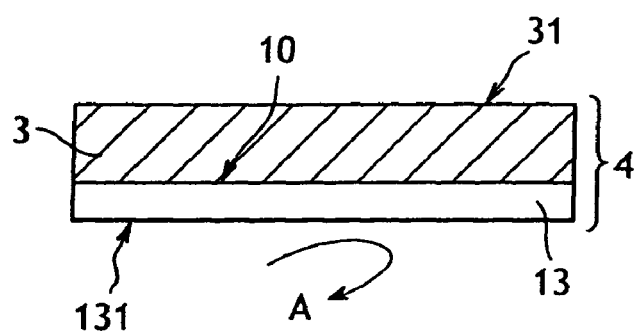
Figure 2E:
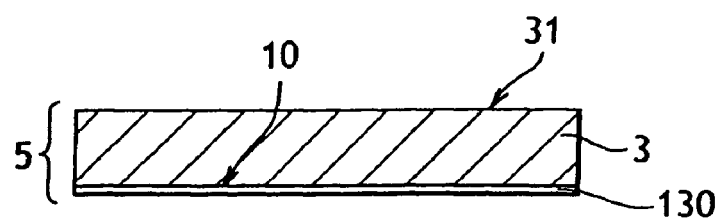

FIG. 2D illustrates an intermediate structure 4 that is obtained, which includes the support substrate 3 and the useful layer 13, which is then termed the "transferred layer". As shown in FIG. 2D, a thinning process (arrow A) is then conducted on the transferred useful layer 13 to obtain an ultrathin layer 130 as shown in FIG. 2E. The final structure 5 includes the support 3 and the ultrathin layer 130.

The thinning process can include one of more of the following techniques, for example: chemical-mechanical polishing (CMP), annealing in an atmosphere containing hydrogen and/or argon, sacrificial oxidation, or dry or wet chemical etching.

Chemical-mechanical polishing is a technique that combines mechanical polishing and chemical polishing. The mechanical polishing may be conducted by passing a rotary polishing head over the free surface 131 of the transferred layer 13. Chemical polishing can be implemented by distributing an abrasive in the form of a liquid or paste, such as a colloidal silica, between the surface of the polishing head and the surface 131.

Annealing in an atmosphere containing hydrogen and/or argon includes annealing the intermediate structure 4 in the atmosphere at a temperature of about 1050° C. to 1350° C. for several tens of seconds to several tens of minutes. The annealing process rearranges the atoms on the surface 131, which are displaced into a stable energy level, and smoothes the surface 131 which reduces the thickness (thinning) of the layer 13.

Sacrificial oxidation includes heating the free surface 131 in an oxidizing atmosphere to form an oxide layer which is removed, and repeating that operation a plurality of times until the desired thickness for the ultrathin layer 130 is reached.

Finally, chemical etching operations include wet etching carried out in a bath of chemical products, or dry etching carried out in a plasma of a gas, which etch the transferred layer 13. Ionic bombardment could also be used to dry etch, for example by using argon, which has a mechanical ballistic effect that reduces the thickness of the layer 13 until the ultrathin layer 130 is obtained.

The final thickness of the ultrathin layer 130 after using such thinning treatments is about 100 nanometers (100 nm) or less, or even about 50 nanometers (50 nm) or less.

The heat annealing treatment described above, used for strengthening the bonding interface between the front face 10 of the source substrate 1 and the front face 30 of the support 3, can also be carried out during the detachment step or thereafter, but is always used before the thinning treatment. The annealing heat treatments can also be repeated a plurality of times between the bonding and thinning treatments. It should be noted that when heat annealing is conducted during the detaching step, it is possible to utilize a single heat treatment employing increasing temperatures. For example, when the source substrate 1 is made of silicon, detachment along the zone of weakness 12 is conducted at about 500° C., and when the temperature reaches at least about 1000° C. it is maintained at that level for several hours in order to strengthen the bonding interface.

In accordance with the present technique, and in contrast to the current state of the art, the method of producing an ultrathin layer 130 includes passing through an intermediate step (obtaining an intermediate structure 4) during which a useful layer 13 is transferred, wherein the useful layer has a thickness that is substantially greater than that of a desired ultrathin layer 130. The term "substantially greater" means that the useful layer 13 which will be transferred has a thickness sufficient to withstand the different heat treatments (used for the purposes of detachment or strengthening the bonding interface) without causing the formation of defects or blisters at the interface. Preferably, the useful layer 13 is at least three times thicker than the ultrathin layer 130. In a preferred implementation, the useful layer 13 is at least about 300 nanometers thick, while in comparison, the ultrathin layer 130 is equal or less than about 100 nanometers thick, and may be less than about 50 nanometers thick.

Figure 3A:
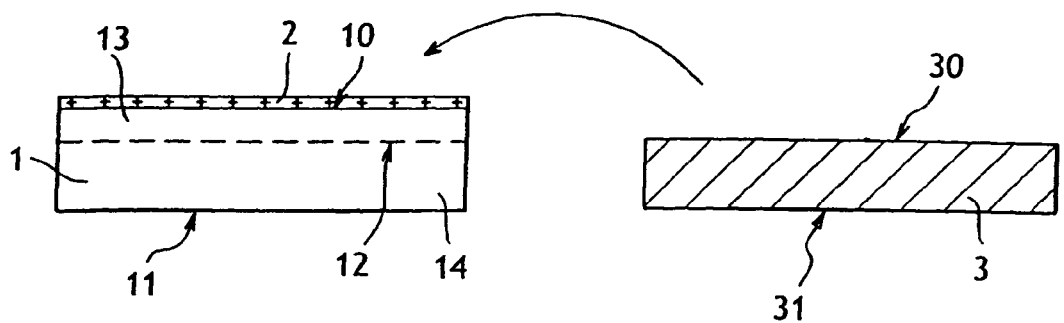
FIGS. 3A to 3E illustrate the steps of a second embodiment of a method for forming a semiconductor structure having an ultrathin layer on a substrate according to the invention.
Figure 3B:
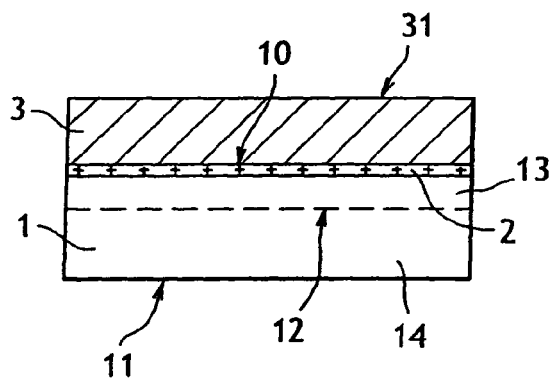

FIGS. 3A to 3E show a variation of the method described above with respect to FIGS. 2A to 2E. As shown in FIG. 3B, in this variation an intermediate layer 2 is inserted between the front face 10 of the source substrate 1 and the front face 30 of the support surface 3. As shown in FIG. 3A, the intermediate layer 2 is formed before bonding by wafer bonding, preferably on the front face 10 of the support substrate 1. However, the intermediate layer could also be formed on the front face 30 of the support substrate 3, or on both front faces 10 and 30.

This intermediate layer 2 can, for example, be produced by using a chemical vapor deposition technique (CVD), or by epitaxial techniques, namely metal organic chemical vapor deposition (MOCVD), molecular beam epitaxy (MBE), or by hydride vapor phase epitaxy (HVPE). When the intermediate layer 2 is an oxide, it can also be produced by oxidizing the bulk substrate 1.

When the zone of weakness 12 is produced by implanting atomic species, the intermediate layer 2 is preferably deposited prior to implantation. This is because a large rise in temperature connected with the deposition method may be detrimental to the zone of weakness 12. In contrast, when the zone of weakness 12 is a porous layer, the intermediate layer 2 is deposited after forming the porous layer and the useful layer 13, the intermediate layer generally being formed by epitaxy. The intermediate layer 2 can, for example, be a layer of insulating material, in particular silicon oxide ($SiO_2$), silicon nitride ($Si_3N_4$), diamond, an insulating material with a high permittivity, or a combination of these materials, for example silicon oxynitride. The intermediate layer 2 can also be made of a plurality of different layers of such materials (multilayer).

Figure 3C:
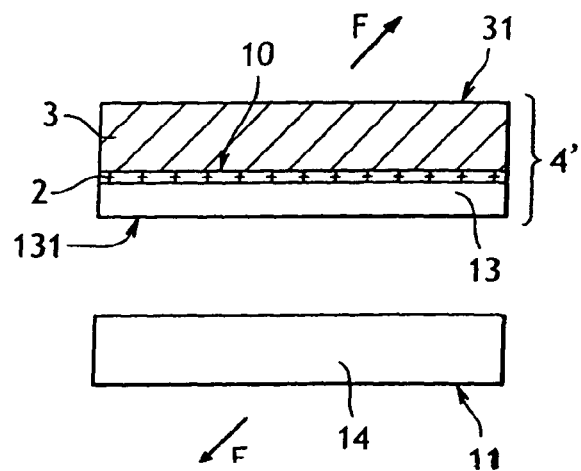
Figure 3D:
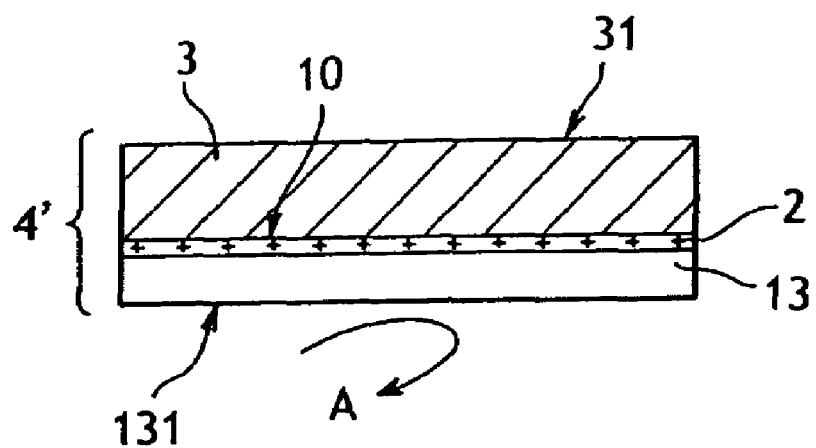
Figure 3E:
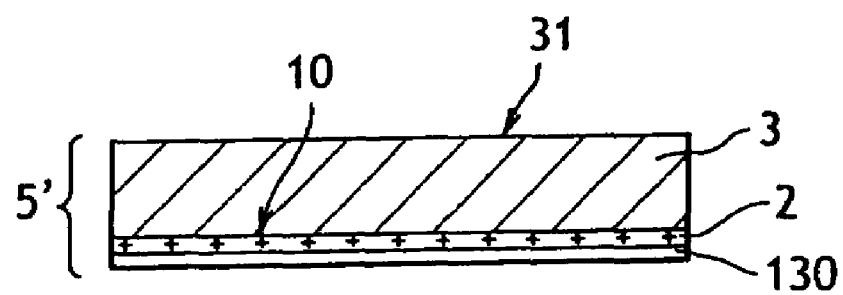

The other steps of this variation of the present method are identical to those described above and thus will not be repeated in detail. It should be noted that after detaching the useful layer from the source substrate as shown in FIG. 3C, an intermediate structure 4' is formed that includes the support 3, the intermediate layer 2 and the transferred layer 13. A thinning operation is shown in FIG. 3D, and in FIG. 3E the support substrate 3 supports, in succession, the intermediate layer 2 then the ultrathin layer 130 to form a final structure 5'. Preferably, the intermediate layer 2 is thin, being about 50 nanometers or less.

The present method can be used to produce a SOI type substrate wherein the silicon oxide intermediate layer and the superficial silicon layer are both less than about 50 nm thick, which has not been possible until now.

Four particular examples of the method of the invention will now be described.

EXAMPLE 1

Thermal oxidation of a source substrate 1 formed from bulk silicon was carried out to cover it with an intermediate layer 2 of silicon oxide ($SiO_2$) that was about 50 nanometers thick. The zone of weakness 12 was then formed by implanting hydrogen ions $H^+$ using an implantation dose of $8 \times 10^{16} H^+/cm^2$ and an implantation energy of 210 keV to obtain a useful layer 13 with a thickness of about 1.9 micrometers (1.9 $\mu$m). The bulk silicon support substrate was then bonded to the oxide layer 2 by wafer bonding. The remainder 14 of the source substrate 1 was then detached by using a heat treatment of less than 500° C., and the bonding interface was strengthened by using a heat treatment of more than about 1000° C. Finally, a thinning treatment was conducted using polishing and sacrificial oxidation to obtain a final structure 5' with an ultrathin silicon layer 130 having a thickness of about 50 nm, which could have been reduced further to 20 nm thick if the thinning step was continued.

EXAMPLE 2

The procedure described above concerning Example 1 was followed, except that the silicon oxide layer 2 was 20 nanometers thick.

EXAMPLE 3

The procedure described above concerning Example 1 was followed, except that the implantation dose was $7 \times 10^{16} H^+/cm^2$ and the implantation energy was 160 keV, so that the useful layer 13 was 1.5 micrometers (1.5 $\mu$m) thick.

EXAMPLE 4

The procedure of Example 3 was followed, except that the silicon oxide layer 2 was 20 nanometers thick.

What is claimed is:

1. A method of producing a semiconductor structure having at least one support substrate and an ultrathin layer comprising:
    bonding a support substrate to a source substrate, wherein the source substrate includes a front face and a zone of weakness below the front face that defines an useful layer, the useful layer being of sufficient thickness to withstand heat treatments without forming defects therein and at least about 300 nanometers thick so that it can be reduced in thickness to form the ultrathin layer;
    detaching the useful layer along the zone of weakness to obtain an intermediate structure including at least the transferred useful layer and the support substrate; and
    treating the transferred useful layer to obtain an ultrathin layer on the support substrate that is suitable for use in applications in the fields of electronics, optoelectronics or optics.

2. The method of claim 1 which further comprises providing an intermediate layer on the support substrate or on the source substrate before the bonding step such that, after the detaching step, an alternate intermediate structure is obtained that includes the support substrate, the intermediate layer and the useful layer.

3. The method of claim 2 wherein the intermediate layer has a thickness that is equal or less than about 50 nanometers.

4. The method of claim 2 wherein the intermediate layer is made of insulating material.

5. The method of claim 4 wherein the intermediate layer is made of a material of at least one of silicon oxide, silicon nitride, a high permittivity insulating material, diamond, or a combinations of the materials.

6. The method of claim 1 wherein the useful layer is at least three times thicker than the ultrathin layer before treatment.

7. The method of claim 1 wherein the ultrathin layer is equal to or less than about 100 nanometers thick following the treating step.

8. The method of claim 7 wherein the ultrathin layer is less than about 50 nanometers thick.

9. The method of claim 1 which further comprises treating the transferred useful layer by using at least one of chemical-mechanical polishing, annealing in an atmosphere containing hydrogen, argon or a mixture thereof, sacrificial oxidation, and chemical etching.

10. The method of a claim 1 which further comprises heat annealing conducted after the bonding step and before the treatment step.

11. The method of claim 10 wherein the heat annealing is conducted during the detaching step.

12. The method of claim 10 wherein heat annealing treatment is conducted before the detaching step.

13. The method of claim 1 which further comprises providing the zone of weakness by atomic species implantation.

14. The method of claim 1 which further comprises providing the zone of weakness as a porous layer in the source substrate.

15. The method of claim 1 which further comprises applying at least one of mechanical and thermal stresses during the detaching step.

16. The method of claim 1 which further comprises etching cavities into a front face of the useful layer before bonding.

17. The method of claim 1 wherein the source substrate is made of at least one of silicon, silicon carbide, germanium, silicon germanium, a Group (IV—IV) compound material, and a Group (III–V) compound material.

18. The method of claim 1 wherein the support substrate is made of at least one of silicon, silicon carbide, germanium, silicon germanium, a Group (IV—IV) compound, and a Group (III–V) compound.

19. A method of producing a semiconductor structure having at least one support substrate and an ultrathin layer comprising:

bonding a support substrate to a source substrate, wherein the source substrate includes a front face and a zone of weakness below the front face that defines an useful layer, the useful layer being of sufficient thickness to withstand heat treatments without forming defects therein so that it can be reduced in thickness to form the ultrathin layer;

detaching the useful layer along the zone of weakness to obtain an intermediate structure including at least the transferred useful layer and the support substrate;

providing an intermediate layer on the support substrate or on the source substrate before the bonding step such that, after the detaching step, an alternate intermediate structure is obtained that includes the support substrate, the intermediate layer and the useful layer; and treating the transferred useful layer to obtain an ultrathin layer on the support substrate that is suitable for use in applications in the fields of electronics, optoelectronics or optics;

wherein the intermediate layer has a thickness that is equal or less than about 50 nanometers and the useful layer is at least about 300 nanometers thick.

20. A method of producing a semiconductor structure having at least one support substrate and an ultrathin layer comprising:

bonding a support substrate to a source substrate, wherein the source substrate includes a front face and a zone of weakness below the front face that defines an useful layer, the useful layer being of sufficient thickness to withstand heat treatments without forming defects therein so that it can be reduced in thickness to form the ultrathin layer;

detaching the useful layer along the zone of weakness to obtain an intermediate structure including at least the transferred useful layer and the support substrate;

providing an intermediate layer on the support substrate or on the source substrate before the bonding step such that, after the detaching step, an alternate intermediate structure is obtained that includes the support substrate, the intermediate layer and the useful layer;

treating the transferred useful layer to obtain an ultrathin layer on the support substrate that is suitable for use in applications in the fields of electronics, optoelectronics or optics; and which further comprises treating the transferred useful layer by using at least one of chemical-mechanical polishing, annealing in an atmosphere containing hydrogen, argon or a mixture thereof, sacrificial oxidation, and chemical etching;

wherein the intermediate layer is made of a material of at least one of silicon oxide, silicon nitride, a high permittivity insulating material, diamond, or a combinations of the materials, the useful layer is at least three times thicker than the ultrathin layer before treatment, and the ultrathin layer is equal to or less than about 100 nanometers thick following the treating step.

* * * * *